United States Patent [19]

Eyerly et al.

[11] Patent Number: 5,134,397
[45] Date of Patent: Jul. 28, 1992

[54] PHASE COMPENSATION FOR ELECTROMAGNETIC RESOLVERS

[75] Inventors: Bruce N. Eyerly, Torrance; Donald R. Cargille, Culver City, both of Calif.

[73] Assignee: Hughes Aircraft Company, Los Angeles, Calif.

[21] Appl. No.: 716,179

[22] Filed: Jun. 17, 1991

[51] Int. Cl.[5] ............................................. H03M 1/48
[52] U.S. Cl. .................................... 341/116; 341/111; 318/605
[58] Field of Search ................ 341/111, 112, 113, 114, 341/115, 116, 117; 318/605, 660, 661, 562, 636

[56] References Cited

U.S. PATENT DOCUMENTS

| | | | |
|---|---|---|---|
| 3,878,535 | 4/1975 | Twiss | 341/116 |
| 4,099,245 | 7/1978 | Maysonett | 364/603 |
| 4,468,745 | 8/1984 | Kjosavik | 364/559 |
| 4,989,001 | 1/1991 | Serev | 341/116 |

Primary Examiner—A. D. Pellinen
Assistant Examiner—B. K. Young
Attorney, Agent, or Firm—Gordon R. Lindeen, III; Steven M. Mitchell; Wanda K. Denson-Low

[57] ABSTRACT

A phase compensation circuit for use with a resolver circuit that compensates for resolver angle measurement error without the use of special compensation windings on the resolver or the buffer amplifier associated with the compensation windings. With the present invention, primary windings from a plurality of resolvers may be reduction over conventional circuits. A digital computer is employed to process integrated data indicative of the phase shift of signals generated by the resolver, and compute error correction signals that compensate sine and cosine angle data output signals of the resolver. No resolver compensation windings are necessary and no additional electronic equipment is necessary. The present invention provides increased accuracy to fulfill more stringent angle measurement specifications.

17 Claims, 2 Drawing Sheets

PHASE COMPENSATION FOR ELECTROMAGNETIC RESOLVERS

BACKGROUND

The present invention relates generally to electromagnetic resolvers, and more particularly, to phase compensation for electromagnetic angle resolvers.

Electromagnetic angle resolvers provide mechanical shaft angle data to electronic circuits by means of electric signals. In a typical complex system, many such resolvers are used. Conventional compensation techniques required a separate excitation power amplifier to drive the primary winding of each resolver. The demodulation or decoding of the signals from each resolver is typically synchronized to the signal used to excite the resolver. However, the resolver output signals (sine and cosine) are inadvertently phase shifted with respect to the resolver excitation signal, which reduces angle measurement accuracy. The phase shift of the resolver output signals also changes with temperature.

The simplest approach used in the prior art was to do nothing to correct the phase shift problem, and therefore accept the resulting resolver inaccuracies. Other conventional compensation methods employed an additional compensation winding in the resolver, hardware to receive the compensation signal generated by the additional compensation winding, and separate closed-loop, stability-compensated feedback amplifiers for each resolver primary. This extra hardware resulted in lower system performance and higher system cost.

Accordingly, it is an objective of the present invention to provide phase compensation for electromagnetic angle resolvers that does not require additional windings and associated amplification circuitry and which allows a single excitation power amplifier to drive all the resolver primary windings.

SUMMARY OF THE INVENTION

In order to overcome the deficiencies existing in conventional systems, the present invention comprises a phase compensation circuit that corrects (compensates) for resolver angle measurement error without the use of special compensation windings on the resolver, the buffer amplifier associated with the special winding and separate power amplifiers for each primary winding. With the present invention, primaries from a plurality of resolvers may be connected in parallel and powered by a single compensating circuit, which provides a major hardware reduction over conventional circuits.

More specifically, the phase compensation circuit of the present invention may be used with a conventional electromagnetic angle resolver that is adapted to provide analog sine and cosine output signals. The phase compensation circuit comprises a multiplexer coupled to the outputs of a plurality of resolvers all having their primary windings supplied from a common source. An integrate and dump filter is coupled to the multiplexer for integrating the analog sine and cosine output signals. An analog to digital converter is coupled to the integrate and dump filter for converting the analog sine and cosine output signals into digital sine and cosine output signals. A clock oscillator provides a clock signal to synchronize the timing of a digital computer. The digital computer is adapted to provide a reference excitation signal for the resolvers whose timing is accurately controlled by the clock oscillator.

A digital computer is coupled to the multiplexer for timing the selective processing of the analog sine and cosine output signals from the plurality of resolvers. A dump control output is coupled from the computer to the integrate and dump filter for selectively dumping the analog sine and cosine output signals. The computer also receives a digital input from the analog to digital converter and a clock input signal from the clock oscillator that synchronizes the phase compensation circuit. The computer provides digital output angle data.

A low pass filter is coupled to a square wave output of the digital computer for smoothing the square wave into a sine wave, and a power amplifier is coupled between the low pass filter and the primary input of the resolver for driving the primary windings of the plurality of resolvers.

The advantages of the invention include the provision of increased accuracy and/or reduced circuit complexity. For example, when the present phase compensation circuit was analyzed, during a research and development project by the assignee of the present invention, electronic processing error was reduced by 50%, resulting in 33% reduction in total resolver angle measurement error. Furthermore, no special resolver compensation windings were required and no additional electronic hardware was required for accuracy improvement.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
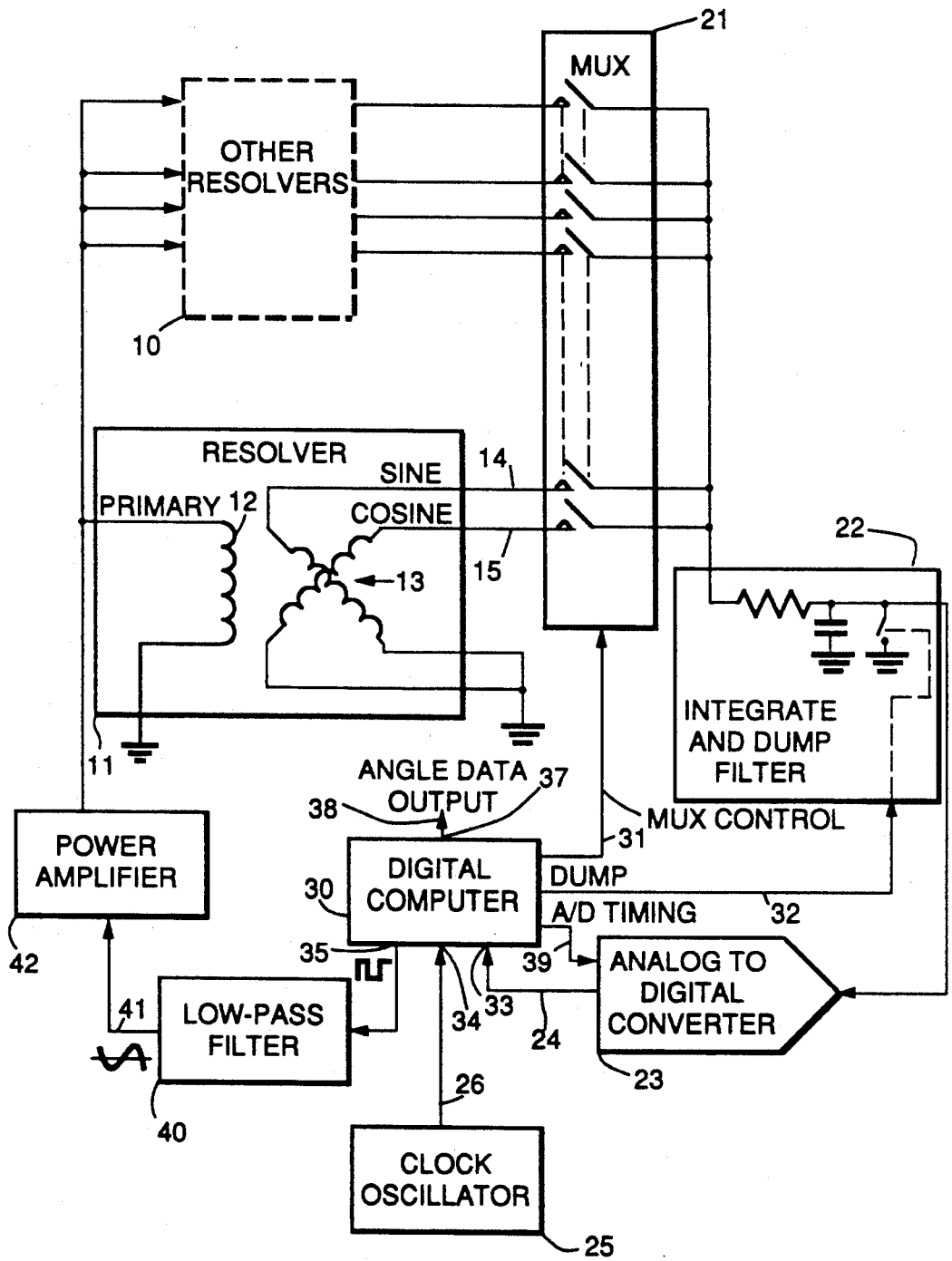
FIG. 1 is a simplified schematic diagram in block form of an embodiment of a resolver phase compensation circuit incorporating the principles of the present invention.

FIG. 1 is a simplified schematic diagram in block form of an embodiment of a resolver phase compensation circuit incorporating the principles of the present invention. A resolver 11 has a primary winding 12 and a pair of secondary windings 12 and a pair of secondary windings 13 and is adapted to provide analog sine and cosine output signals on two output lines 14, 15. Also shown in FIG. 1 is a dashed box 10 representing a plurality of additional resolvers that have their primary windings driven by the same power source, as will be described below. The phase compensation circuit of the present invention comprises a multiplexer 21 coupled to the output of the resolver 11 and to the output of the dashed box 10 representing a plurality of additional resolvers. The multiplexer 21 is adapted to selectively process the analog sine and cosine output signals. An integrate and dump filter 22 is coupled to the multiplexer 21 and is adapted to integrate the analog sine and cosine output signals. An analog to digital converter 23 is coupled to the integrate and dump filter 22 and is adapted to convert the integrated sine and cosine output signals into digital output signals at an A/D output lead 24. A clock oscillator 25 provides a clock signal 26.

A digital computer 30 has a multiplexer control output 31 coupled to the multiplexer 21 that is adapted to control the timing of the selective processing of the analog sine and cosine output signals from the plurality of resolvers. A dump control output 32 from the digital computer 30 is coupled to the integrate and dump filter 22 for controlling the timing of the dumping of the integrated analog sine and cosine output signals. An A/D timing control output 39 from the digital computer 30 is coupled to the analog to digital converter 23 controlling the timing of the analog to digital converter 23. A digital input 33 of the digital computer 30 is coupled to the A/D output lead 24 of the analog to digital converter 23 for receiving the digital output signals. A clock input 34 of the digital computer 30 is adapted to receive the clock signal 26 from the clock oscillator 25. A square wave output signal 35 from the digital computer 30 is applied to the input of a low pass filter 40. An angle data output terminal 37 is adapted to provide an angle data output signal 38 calculated from compensated sine and cosine signals from the plurality of resolvers.

The low pass filter 40 is adapted to filter the square wave output signal 35 from the digital computer 30 to provide a sine wave signal 41. A power amplifier 42 is coupled between the low pass filter 40 and the primary winding 12 of the resolver 11, as well as the primary windings of a plurality of additional resolvers 10, for amplifying the sine wave reference signal 41 provided by the low pass filter 40.

The square wave output signal 35 is smoothed into a sine wave by the low pass filter 40, which is another source of phase shift and phase shift drift that is automatically compensated by the phase compensation circuit of the present invention. The prior art dealt with filter phase shift by connecting a comparator to the sine wave signal 41 from the filter 40. The comparator compared the timing of the sine wave signal 41 with the timing of the clock signal 26. The comparator made corrections by reinitializing the timing of the sine wave signal 41. The smoothed sine wave signal 41 provided by the low pass filter 40 drives the power amplifier 42 which excites all primary windings of the resolvers connected thereto. The sine and cosine signals from the resolvers are selected in turn by the multiplexer 21 and processed by the integrate and dump filter 22 and then converted by the analog to digital converter 23 into a form that is processable by the computer 30. The integrate and dump filter may be implemented as a classic Operational Amplifier Integrator, if desired. For simplicity, it is pictured in FIG. 1 as an RC network.

Some embodiments of the phase compensation circuit of the present invention provide a digital timing circuit (not shown) to generate the control signals for the multiplexer 21 and the integrate and dump filter 22. Such digital timing circuits may be implemented in either software or hardware. The functions of such digital timing circuits are provided by the digital computer 30.

The digital computer 30 is the heart of the phase compensation circuit of the present invention. Its timing is synchronized by the clock oscillator 25. The digital computer 30 provides a square wave of the appropriate frequency that is smoothed into a sine wave to excite the resolver 11. The digital computer 30 provides for the timing and operation of the multiplexer 21, the analog to digital converter 23, and the integrate and dump filter 22 by way of the control signals provided on the multiplexer and dump control outputs 31, 32 and the A/D timing control output 39. The digital computer 30 accepts the digital output signals provided by the analog to digital converter 23 on the A/D output lead 24, performs all necessary calculations, and outputs angle data comprising the phase compensated angle data output signal 38. The angle data output signal 38 includes angle data calculated from the compensated sine and cosine signals from the resolver 11 and from the dashed box 10 representing a plurality of additional resolvers. The digital computer 30 may also use the angle data internally for other control functions, if desired.

Figure 2:
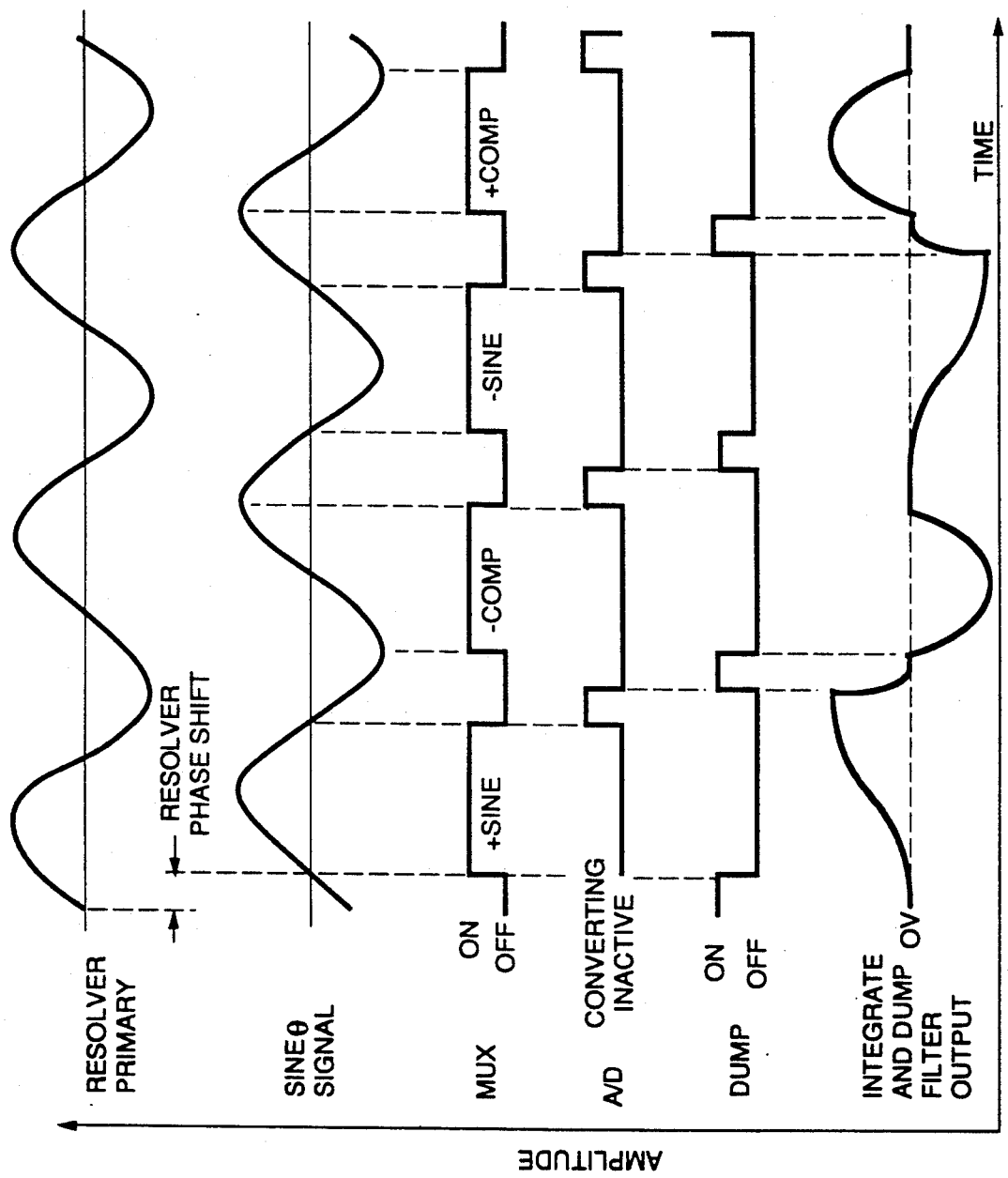
FIG. 2 is a graph of amplitude versus time for a series of waveforms illustrating the operation of the resolver phase compensation circuit shown in FIG. 1.

FIG. 2 is a graph of amplitude versus time for a series of waveforms illustrating the operation of the resolver phase compensation circuit shown in FIG. 1. FIG. 2 shows a situation when the sine signal is larger in amplitude than the cosine signal. The top two waveforms show the excitation of the resolver 11 and the sine signal with the inadvertent phase shift between them. The multiplexer 21 turns on to sample the sine signal four times, and each of these sample times is labeled in FIG. 2. The sample times labeled "+ sine" and "− sine" are used determine the amplitude of the sine signal. This comprises substantially the same uncompensated processing as was done in the prior art. The multiplexer 21 sample times labeled "− comp" and "+ comp" are novel. These sample times are used to measure the phase shift of the output of the resolver 11 so that the timing can be adjusted to compensate for this phase shift. When the cosine signal is larger than the sine signal, the + and − comp signals are taken from the cosine signal instead of the sine signal.

The relative timing of the three digital waveforms, identified as MUX, A/D, and DUMP (representative of the control signals for the multiplexer 21, analog to digital converter 23, and the integrate and dump filter 22), is constant, but all of the signals may be shifted together either forward or back in phase (time). When the phase compensation is correct, the output of the integrate and dump filter 22 is zero after a "comp" sample. However, a phase shift error produces an error voltage. Error voltages of opposite polarity are produced by the two samples so the "− comp" value is substracted from the "+ comp" value to compute the final phase error. The sine magnitude is computed similarly by subtracting the "− sine" value from the "+ sine" value. The phase delay is then shifted forward or back by one increment according to the following table:

| phase error polarity | sine magnitude polarity | phase shift delay gets incremented by |
| --- | --- | --- |
| − | + | −1 |
| + | + | +1 |
| − | − | +1 |
| + | − | −1 |

Sampling and combining both polarities averages the phase shift over both half cycles and eliminates offset errors.

The resulting slow negative feedback servo control eventually brings the phase shift to within one increment of zero. Drift in phase shift is caused by temperature changes and aging and so is very slow. Consequently, the slow servo action of the phase compensation circuit of the present invention is more then fast enough to keep up with the phase drift caused by temperature drift. The servo-computed delay associated with each resolver (including the low-pass filter delay) is stored in a separate computer memory location and recalled for use and updating each time the associated resolver is sampled.

Thus there has been described new and improved circuitry that provides phase compensation for electromagnetic resolvers. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A phase compensation circuit for use with a plurality of resolvers that provide analog sine and cosine output signals, said phase compensation circuit comprising:

a multiplexer coupled to sine and cosine windings of the plurality of resolvers for selectively processing the analog sine and cosine output signals;

an integrate and dump filter coupled to the multiplexer for integrating the analog sine and cosine output signals;

an analog to digital converter having a timing control input and coupled to the filter for converting the integrated sine and cosine output signals into digital sine and cosine output signals;

a clock oscillator for providing clock signals that are adapted to synchronize the phase compensation circuit;

a digital computer coupled to the multiplexer for controlling the processing of the analog sine and cosine output signals, coupled to the integrate and dump filter for controlling the outputting of the analog sine and cosine output signals from the integrate and dump filter, coupled to the analog to digital converter for receiving the digital sine and cosine output signals for processing, and coupled to the clock oscillator for receiving the clock signal therefrom, the computer having a timing control output coupled to the timing control input for controlling the timing of the analog to digital converter, the computer computing and providing a phase compensated angle data output signal based on sine and cosine signals from the plurality of resolvers;

the digital computer being adapted to process the digital sine and cosine output signals to provide positive and negative polarity amplitude sample signals and positive and negative polarity compensation sample signals, and to apply a phase delay to the timing control output to shift the relative phase thereof as a function of a phase error derived from the sample signals such that (1) when the phase error polarity is minus and the sine magnitude polarity is plus, the phase shift delay is incremented by −1, (2) when the phase error polarity is plus and the sine magnitude is polarity is plus, the phase shift delay is incremented by +1, (3) when the phase error polarity is minus and the sine magnitude polarity is minus, the phase shift delay is incremented by +1, and (4) when the phase error polarity is plus and the sine magnitude polarity is minus, the phase shift delay is incremented by −1, such that sampling and combining signals having both polarities averages the phase shift over two half cycles and eliminates offset errors.

2. A phase compensation circuit for use with a plurality of resolvers that provide analog sine and cosine output signals, said phase compensation circuit comprising:

a multiplexer coupled to sine and cosine windings of the plurality of resolvers for selectively processing the analog sine and cosine output signals;

an integrate and dump filter coupled to the multiplexer for integrating and dumping the analog sine and cosine output signals;

an analog to digital converter coupled to the integrate and dump filter for converting the sine and cosine output signals into digital sine and cosine output signals;

a clock oscillator for providing clock signals that are adapted to synchronize the phase compensation circuit;

a digital computer having a multiplexer control output coupled to the multiplexer for controlling the selective processing of the analog sine and cosine output signals, a dump control output coupled to the integrate and dump filter for selectively dumping the integrate and dump filter, a timing control output for controlling the timing of the analog to digital converter, a digital signal input coupled to the analog to digital converter for receiving the clock signals from the clock oscillator, a square wave output for outputting a square wave for processing into an excitation signal for primary windings of said plurality of resolvers, and an angle data output for providing a digital angle data output signal wherein the digital computer is adapted to process the digital sine and cosine output signals four times per angle data output signal cycle to provide positive and negative polarity amplitude sample signals and positive and negative polarity compensation sample signals;

and wherein the digital computer is adapted to apply a phase delay to the timing control output to shift the relative phase thereof as a function of the phase error derived from the sample signals such that (1) when the phase error polarity is minus and the sine magnitude polarity is plus, the phase shift delay is incremented by −1, (2) when the phase error polarity is plus and the sine magnitude polarity is plus, the phase shift delay is incremented by +1, (3) when the phase error polarity is minus and the sine magnitude polarity is minus, the phase shift delay is incremented by +1, and (4) when the phase error polarity is plus and the sine magnitude polarity is minus, the phase shift delay is incremented by −1, such that sampling and combining both polarities averages the phase shift and eliminates offset errors;

a low pass filter coupled to the square wave output of the digital computer for smoothing the square wave output signals provided by the computer; and a power amplifier coupled between the low pass filter and the primary windings of the plurality of resolvers for amplifying the smoothed square wave output signals and for coupling them to the primary windings of the plurality of resolvers.

3. The phase compensation circuit of claim 2 wherein the plurality of resolvers have their respective primary windings coupled in parallel to the power amplifier.

4. A phase compensated resolver circuit comprising:

at least one resolver adapted to provide analog sine and cosine output signals;

an integrator coupled to the at least one resolver for integrating the analog sine and cosine output signals provided by the at least one resolver;

an analog to digital converter coupled to the integrator for converting the integrated analog sine and cosine output signals into digital output signals;

a processor having a timing control output for sampling the sine and cosine output signals to provide positive and negative polarity amplitude sample signals and positive and negative polarity compensation sample signals, and applying a phase shift delay to the timing control output to shift the relative phase thereof as a function of a phase error derived from the sample signals such that (1) when the phase error polarity is minus and the sine magnitude polarity is plus, the phase shift delay is incremented by $-1$, (2) when the phase error polarity is plus and the sine magnitude polarity is plus, the phase shift delay is incremented by $+1$, (3) when the phase error polarity is minus and the sine magnitude polarity is minus, the phase shift delay is incremented by $+1$, and (4) when the phase error polarity is plus and the sine magnitude polarity is minus, the phase shift delay is incremented by $-1$, whereby sampling and combining signals having both polarities averages the phase shift and eliminates offset errors.

5. The resolver circuit of claim 4 wherein the at least one resolver comprises a plurality of resolvers having their respective primary windings coupled in parallel to the processor and their respective outputs coupled to the integrator.

6. The resolver circuit of claim 4 wherein the at least one resolver comprises a plurality of resolvers and wherein the integrator comprises:

a multiplexer coupled to the plurality of resolvers for selectively processing the analog sine and cosine output signals provided by the plurality of resolvers; and an integrate and dump filter coupled to the multiplexer for integrating the analog sine and cosine output signals.

7. The resolver circuit of claim 4 wherein the processor further comprises:

a clock oscillator for providing a clock signal thereto that synchronizes the processing performed by the circuit.

8. A phase compensation circuit for a resolver having sine and cosine windings comprising:

a. an integrator coupled to the sine and cosine windings for integrating output signals received from the windings;

b. a sampler coupled to the integrator for sampling the integrated sine and cosine output signals;

c. a processor coupled to the sampler for receiving the integrated sine and cosine samples, the processor producing a phase angle data output based on the samples and positive and negative polarity amplitude sample signals and positive and negative polarity compensation sample signals, the processor also generating a timing control output to the sampler for controlling the sampler timing and a phase shift delay for adjusting the phase of the timing control output to reduce phase shift errors in the angle data output, the phase shift delay being derived from a comparison of the amplitude sample signals and the compensation sample signals.

9. The phase compensation circuit of claim 8 wherein the sampler comprises an analog to digital converter.

10. The phase compensation circuit of claim 8 wherein the integrator comprises an integrate and dump filter.

11. The phase compensation circuit of claim 10 wherein the processor timing control output comprises an integrator timing control output for controlling the integrate and dump filter timing.

12. The phase compensation circuit of claim 8 wherein the integrator comprises:

a. a multiplexer coupled to a plurality of resolvers for selectively connecting with sine and cosine output signals received from a specific one of the plurality of resolvers; and b. an integrate and dump filter coupled to the multiplexer for integrating sine and cosine output signals received from the multiplexer.

13. The phase compensation circuit of claim 8 wherein the processor derives the phase shift delay from the sample signals such that (1) when the phase error polarity and the sine magnitude polarity are the same, the phase shift delay is increased, and (2) when the phase error polarity and the sine magnitude polarity are opposite, the phase shift delay is decreased.

14. A method for compensating for phase errors in sine and cosine output signals received from resolver windings comprising:

a. integrating the sine and cosine output signals received from the resolver windings;

b. sampling the integrated sine and cosine output signals to provide positive and negative polarity amplitude sample signals and positive and negative polarity compensation sample signals;

c. deriving a phase shift delay from a comparison of the amplitude sample signals and the compensation sample signals; and d. applying the phase shift delay to a timing control signal for controlling the timing of the step of integrating.

15. The method of claim 23 wherein the step of deriving comprises deriving the phase shift delay from the sample signals such that (1) when the phase error polarity and the sine magnitude polarity are the same, the phase shift delay is increased, and (2) when the phase error polarity and the sine magnitude polarity are opposite, the phase shift delay is decreased.

16. The method of claim 14 wherein the step of deriving comprises deriving the phase shift delay from the sample signals such that (1) when the phase error polarity is minus and the sine magnitude polarity is plus, the phase shift delay is incremented by $-1$, (2) when the phase error polarity is plus and the sine magnitude polarity is plus, the phase shift delay is incremented by $+1$, (3) when the phase error polarity is minus and the sine magnitude polarity is minus, the phase shift delay is incremented by $+1$, and (4) when the phase error polarity is plus and the sine magnitude polarity is minus, the phase shift delay is incremented by $-1$.

17. The method of claim 14 further comprising converting the sine and cosine output signals to digital form prior to sampling and wherein the step of applying the phase shift delay comprises applying the phase shift delay to a timing control signal for controlling the timing of the step of converting.

* * * * *